US006783860B1

(12) United States Patent
Frater

(10) Patent No.: US 6,783,860 B1
(45) Date of Patent: Aug. 31, 2004

(54) LAMINATED ENTRY AND EXIT MATERIAL FOR DRILLING PRINTED CIRCUIT BOARDS

(75) Inventor: Mark S. Frater, Lodi, CA (US)

(73) Assignee: R. E. Service Company, Inc., Lodi, CA (US)

( * ) Notice: Subject to any disclaimer, the term of this patent is extended or adjusted under 35 U.S.C. 154(b) by 0 days.

(21) Appl. No.: 09/945,125

(22) Filed: Aug. 30, 2001

Related U.S. Application Data

(60) Provisional application No. 60/290,594, filed on May 11, 2001.

(51) Int. Cl.$^7$ .......................... B32B 27/38; B32B 15/08; B32B 15/14
(52) U.S. Cl. .................... 428/416; 428/413; 428/414; 428/418; 428/297.4; 428/297.7; 428/332
(58) Field of Search ................................. 428/221, 413, 428/414, 416, 418, 457, 297.4, 297.7, 299.1, 332, 411.1

(56) References Cited

U.S. PATENT DOCUMENTS

| | | | |
|---|---|---|---|
| 2,688,348 A | 9/1954 | Sullivan | |
| 2,706,165 A | 4/1955 | Korsgaard | |
| 2,774,698 A | 12/1956 | Jenk et al. | |
| 3,589,975 A | 6/1971 | Andrews et al. | |
| 3,592,722 A | 7/1971 | Morgan | |
| 3,647,592 A | 3/1972 | Woodberry | |
| 3,730,825 A | 5/1973 | Nakane | |
| 3,808,088 A | 4/1974 | Knechtges et al. | |
| 3,932,250 A | 1/1976 | Sato et al. | |
| 3,936,548 A | 2/1976 | Konicek | |
| 3,948,701 A | 4/1976 | Fasbender et al. | |
| 3,977,075 A | 8/1976 | Lynch et al. | |
| 3,984,598 A | 10/1976 | Sarazin et al. | |
| 3,990,926 A | 11/1976 | Konicek | |
| 4,022,648 A | 5/1977 | Woodberry et al. | |
| 4,023,998 A | 5/1977 | Cederberg et al. | |
| 4,092,925 A | 6/1978 | Fromson | |
| 4,113,576 A | 9/1978 | Hutkin | |
| RE29,820 E | 10/1978 | Konicek | |
| 4,179,324 A | 12/1979 | Kirkpatrick | |
| 4,180,608 A | 12/1979 | Del | |
| 4,183,137 A | 1/1980 | Lomerson | |
| 4,311,419 A | 1/1982 | Block | |
| 4,313,996 A * | 2/1982 | Newman et al. ............ 428/215 |
| 4,316,322 A | 2/1982 | Tranberg | |
| 4,351,873 A | 9/1982 | Davis | |
| 4,357,395 A | 11/1982 | Lifshin et al. | |
| 4,381,327 A | 4/1983 | Briere | |
| 4,383,003 A | 5/1983 | Lifshin et al. | |
| 4,383,785 A | 5/1983 | Rice | |
| 4,394,419 A | 7/1983 | Konicek | |
| 4,446,188 A | 5/1984 | Patel et al. | |
| 4,455,181 A | 6/1984 | Lifshin et al. | |
| 4,477,512 A | 10/1984 | Thomas et al. | |
| 4,501,787 A | 2/1985 | Marchetti et al. | |
| 4,519,732 A | 5/1985 | Sutcliffe | |
| 4,568,413 A | 2/1986 | Toth et al. | |
| 4,587,152 A | 5/1986 | Gleichenhagen et al. | |
| 4,597,988 A | 7/1986 | Kukanskis et al. | |
| 4,599,134 A | 7/1986 | Babu et al. | |
| 4,680,897 A | 7/1987 | Daniels et al. | |
| 4,715,116 A | 12/1987 | Thorpe et al. | |
| 4,722,765 A | 2/1988 | Ambros et al. | |
| 4,775,599 A | 10/1988 | Matsuoka et al. | |
| 4,781,495 A | 11/1988 | Hatch et al. | |
| 4,781,969 A | 11/1988 | Kobayashi et al. | |

(List continued on next page.)

FOREIGN PATENT DOCUMENTS

| | | |
|---|---|---|
| DE | 28 43 263 | 2/1980 |
| DE | 31 31 688 | 5/1982 |
| DE | 41 16 543 A | 11/1992 |
| DE | 297 19 716 U | 12/1997 |
| EP | 0 212 124 | 3/1987 |
| EP | 0 235 582 | 9/1987 |
| EP | 299 454 | 1/1989 |
| EP | 0 411 142 A | 2/1991 |
| EP | 0 872 301 A | 10/1998 |
| GB | 1 217 104 A | 12/1970 |
| JP | 52-5353 | 2/1977 |
| JP | 62-208915 | 9/1987 |
| JP | 2-58885 | 2/1990 |
| JP | 2-291191 | 11/1990 |
| JP | 2-310041 | 12/1990 |
| JP | 4-186798 | 7/1992 |

OTHER PUBLICATIONS

Berlin, A.J.; "Lubra Sheet Report, Printed Circuit Board Drilling Properties of Lubra Sheet," GKB Associates, Inc., 750 E. Grand Avenue, Escondido, CA 92025, pp. 1 thru 15, Sep. 2, 1987.

Pohl et al., "Producing and Jointly Processing Base Laminates for Multilayer Printed Circuit Cards," IBM Technical Disclosure Bulletin, vol. 27, No. 8, pp. 4841–4842, Jan., 1985.

Declaration of Robert Jordan, United States District Court, Northern District of California, San Jose Division, Case No. C92–20672 JW (PVT), Nov. 25, 1992.

(List continued on next page.)

*Primary Examiner*—Philip Tucker
*Assistant Examiner*—Michael J Feely
(74) *Attorney, Agent, or Firm*—John P. O'Banion

(57) ABSTRACT

A laminated entry and exit material for drilling planar sheets such as printed circuit boards having a metal foil layer bonded to a fibrous core layer with an adhesive containing a particulate lubricant such as graphite or polyethylene glycol and cold or hot pressed. A second metal layer is preferably bonded to the fibrous core layer. The core of one embodiment of the exit material includes a particulate lubricant such as graphite or polyethylene glycol incorporated in the core at the time of manufacture of the core. The circuit board is placed between the entry and exit materials. Drill friction and heat are reduced by the lubricants and the heat sink provided by the foil thereby extending the service life of a drill.

13 Claims, 2 Drawing Sheets

U.S. PATENT DOCUMENTS

| | | |
|---|---|---|
| 4,788,102 A | 11/1988 | Koning et al. |
| 4,847,146 A | 7/1989 | Yeh et al. |
| 4,853,273 A | 8/1989 | Harris, Jr. |
| 4,872,934 A | 10/1989 | Kameda |
| 4,875,283 A | 10/1989 | Johnston |
| 4,929,370 A | 5/1990 | Hatch et al. |
| 4,961,806 A | 10/1990 | Gerrie et al. |
| 5,030,302 A | 7/1991 | Jud et al. |
| 5,057,372 A | 10/1991 | Imfeld et al. |
| 5,096,522 A | 3/1992 | Kawachi et al. |
| 5,120,590 A | 6/1992 | Savage et al. |
| 5,153,050 A | 10/1992 | Johnston |
| 5,350,621 A | 9/1994 | Yuhas et al. |
| 5,407,744 A | 4/1995 | Mallen Herrero et al. |
| 5,512,381 A | 4/1996 | Konicek et al. |
| 5,674,596 A | 10/1997 | Johnston |
| 5,716,168 A | 2/1998 | Janoff |
| 5,725,937 A | 3/1998 | Johnston |
| 5,789,066 A | 8/1998 | De Mare et al. |
| 5,951,803 A | 9/1999 | Johnston |
| 5,997,983 A | 12/1999 | Caron et al. |
| 6,127,051 A | 10/2000 | Frater |
| 6,129,990 A | 10/2000 | Frater |
| 6,129,998 A | 10/2000 | Frater |
| 6,130,000 A | 10/2000 | Frater |
| 6,200,074 B1 * | 3/2001 | Miller et al. ................. 408/1 R |
| 2002/0123285 A1 * | 9/2002 | Dana et al. ................. 442/237 |

OTHER PUBLICATIONS

Declaration of Glynn Shaw, United States District Court, Northern District of California, San Jose Division, Case No. C92 20672 JW (PVT), Nov. 30, 1992.

Declaration of Alan Gishi, United States District Court, Northern District of California, San Jose Division, Case No. C92 20672 JW (PVT), Dec. 7, 1992.

Memorandum to the Assistant Commissioner of Patents, Responses to Petition for Public Use Proceeding Under 37 CFR 1.292, Ser. No. 07/955,121, United States Patent and Trademark Office, pp. 3–4, Dec. 8, 1994.

Examiner's Action, Ser. No. 07/955,121, United States Patent and Trademark Office, pp. 7–8, Jul. 11, 1996.

Hinton, P., "The High–Yield Challenge in Laminating MLBS," Electronic Packaging and Production, vol. 30, No. 1, pp. 56–61, Jan., 1990.

* cited by examiner

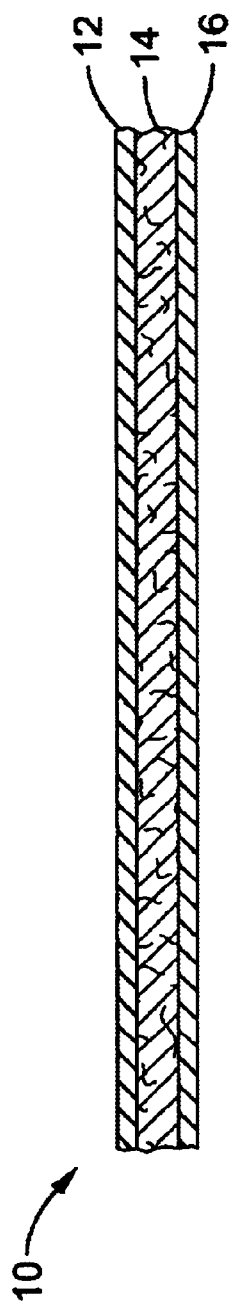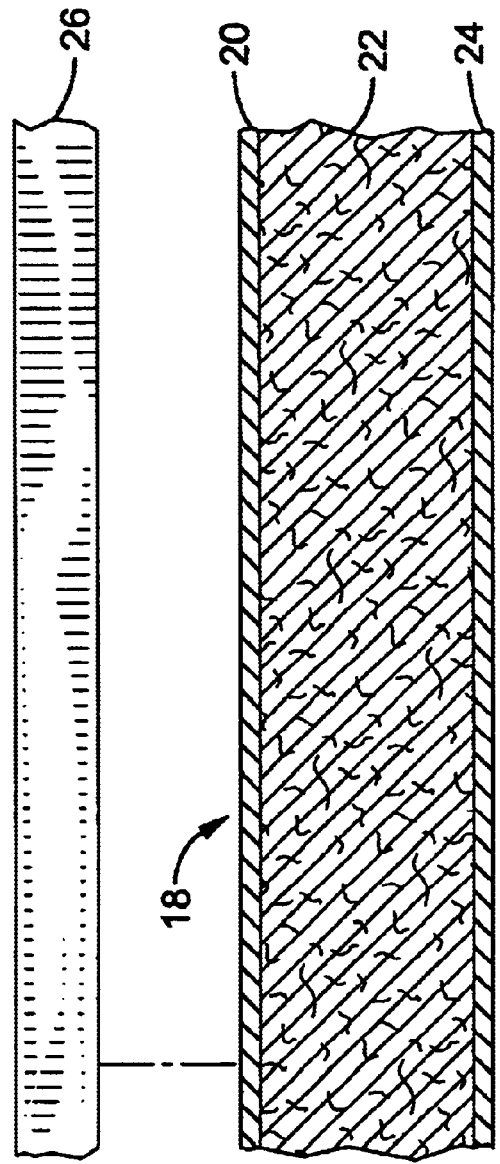

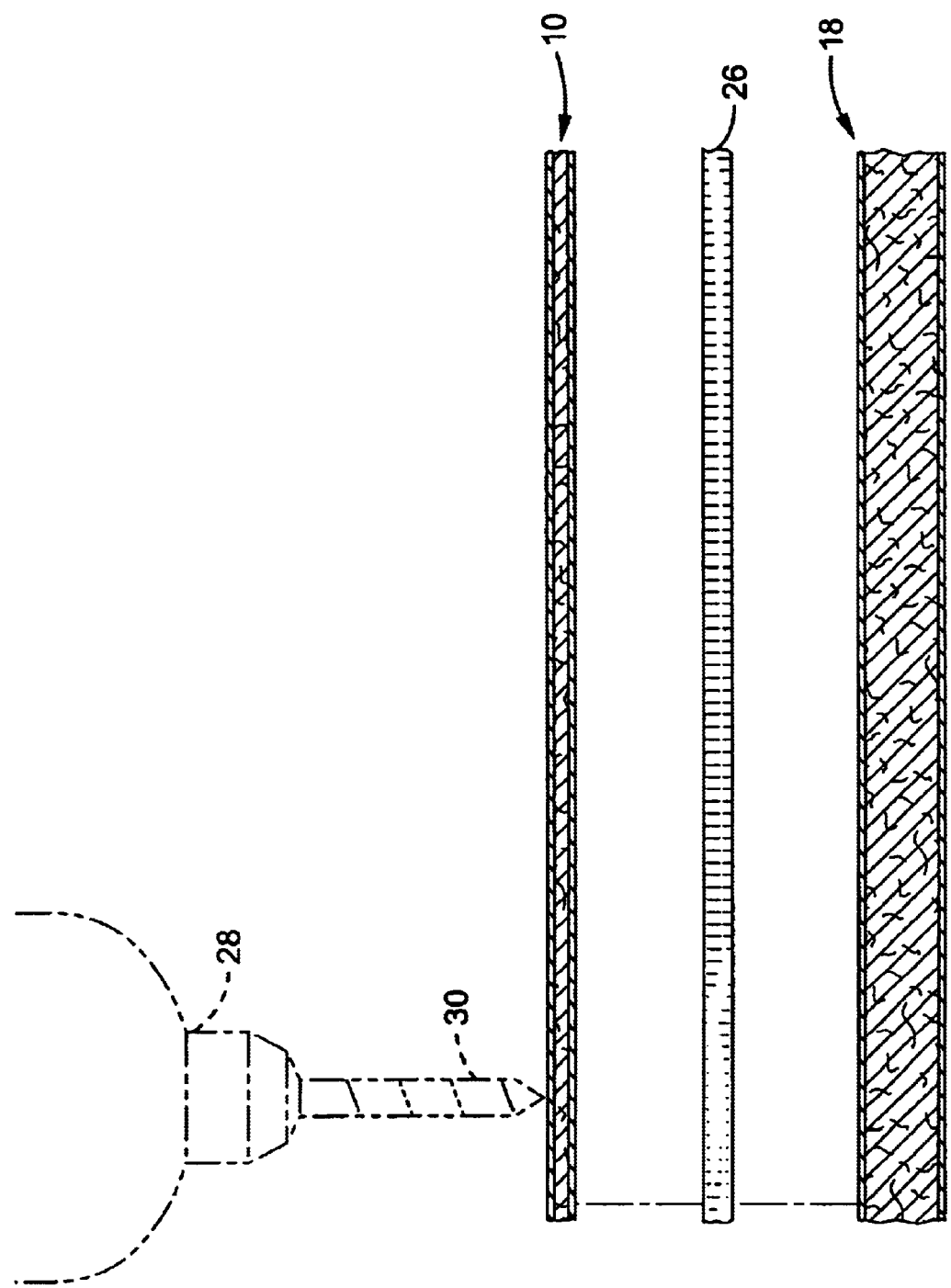

LAMINATED ENTRY AND EXIT MATERIAL FOR DRILLING PRINTED CIRCUIT BOARDS

CROSS-REFERENCE TO RELATED APPLICATIONS

This application claims priority from U.S. provisional application serial No. 60/290,594 filed on May 11, 2001, incorporated herein by reference.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention relates generally to the manufacture of printed circuit boards, and more particularly to an improved entry and exit material for drilling holes in printed circuit board panels.

2. Description of the Background Art

Printed circuit board panels are typically manufactured as multi-layered panels having one or more copper conductive layers separated by at least one electrically insulating layer frequently made from epoxy-glass resin. During fabrication of the board, many holes must be drilled through the board to allow component leads and. support structures to be secured onto the board. Drilling operations have historically created a certain number of defects in the final panel requiring additional work or the panel to be discarded. For example, entry and exit burrs often occur as a result of a build up of drill heat when using rotary drills. Sanding and de-burring equipment was developed to eliminate the burrs. However, drill burrs are often rolled back into the holes during processing of the board and provide a place for gases and solvents to, accumulate and may also preclude proper plating.

Excessive drill heat during the drilling process may also cause what is referred to as hole smearing. A hot drill bit may soften and liquefy the epoxy insulating material from the laminate and smear it through the hole. One solution to the smearing problem has been to apply a strong acid to etch back the smear. However, some material is resistant to acid etch back techniques.

Hole contamination may also occur from the deposition of contaminants by the heated drill bit into the hole. Likewise, a heated drill bit may also cause nail heading. Nail heading occurs when one copper layer deforms and protrudes into an inner copper layer. Nail heading occurs when, the drill bit accumulates material from poor quality laminates creating a dull and ineffective drill bit. The drill press will punch rather than drill through the copper layers thereby pushing a portion of the metal layers into the hole. Pressure feet, used to keep the panel in position, have also been known to create marks in the soft copper conductive layer by engaging the surface as well as driving drilling remnants into the surface of the board.

All of the aforementioned problems may lead to unreliable or unwanted electrical contacts in the circuit board leading to board failure. Accordingly, entry and back up materials were developed in an attempt to alleviate these problems. Entry materials were developed that are placed on the surface of the circuit board prior to drilling and exit materials were placed below the board.

Early entry materials were typically made of paper to protect the board from the pressure foot of the drill. Later entry materials included a thin foil made of aluminum as a heat sink. Phenolic resins were added to the paper layer to provide rigidity and stability to the entry material. Entry materials have been reasonably effective in reducing entry burrs and reduced drill wandering. However,the phenolic resins sometimes contributed to hole smearing and occasional nail heading and such resins are resistant to acid etching. Foil layers were helpful in reducing drill temperatures but the overall service life of the drill bit was still diminished somewhat by the additional cutting required by the bit.

Therefore, a need exists for an entry or exit material that will protect the surface of the circuit board, reduce drill bit wear and drill temperature, as well as reduce the incidence of burring, smearing, heading and drill wandering and the like. A need additionally exists for an entry or exit material that can be easily and inexpensively fabricated. The present invention satisfies those needs, as well as others, and overcomes the deficiencies of previous material designs.

BRIEF SUMMARY OF THE INVENTION

The present invention comprises an entry material and an exit material for use in the drilling process, was well as a method of use. In general terms, the entry material of the present invention comprises a laminate sheet with a top metal foil layer, a center core layer, and a bottom foil layer and a method of use. The exit material of the present invention comprises a laminate of a foil layer or a paper layer and a fiberboard layer.

By way of example, and not of limitation, in accordance with one aspect of the invention, an entry material is provided with a pair of foil sheets. Each foil sheet is laminated to either side of a paper core with an epoxy/particulate lubricant mixture under cold or hot pressure. In one embodiment, graphite powder having a particle diameter of between approximately five microns and fifty microns is added to the epoxy adhesive before lamination. The overall entry laminate thickness is preferably between approximately 0.007 inches and approximately 0.016 inches in thickness. The preferred thickness of the exit material of the present invention is between approximately 0.040 inches and approximately 0.125 inches.

Accordingly, a descending drill bit will encounter a top foil layer, a first layer of graphite and epoxy adhesive, a fibrous core layer, a second layer of graphite and epoxy adhesive and a bottom foil layer. Normally, however, the fibrous core will absorb the adhesive and lubricant mixture during the lamination process so that there are no discrete layers of adhesive.

In another embodiment of the entry material, the particulate lubricant that is mixed with epoxy is polyethylene glycol, having a molecular weight of between approximately 600 and approximately 4000.

In yet another embodiment of the entry material, the bottom foil layer is omitted. In this embodiment, a single layer of foil is applied to a fibrous sheet with lubricant filled epoxy.

Similarly, the exit or back-up material has a single foil layer that is adhered to a fiberboard layer with a homogeneous mixture of epoxy and a particulate lubricant of graphite, polyethylene glycol or both. In one embodiment of the exit material, the fiberboard layer includes graphite or polyethylene glycol as a resin additive when the fiberboard is fabricated. The preferred embodiment of the exit material of the present invention has a single foil layer adhered to the front and, back sides of the exit material. The exit material is turned over after the first drilling with this embodiment to be used for the drilling of a second set of printed circuit boards.

An object of the invention is to provide an entry or exit material for drilling printed circuit boards that improves drilling accuracy and reduces drill wear and drill temperature.

Another object of the invention is to provide a laminate entry or exit material that has a lubricant in the adhesive that is evenly disbursed throughout the adhesive.

A further object of the invention is to provide an entry and exit material that reduces burring and smearing, provides for efficient chip removal, and protects the circuit board from damage from the pressure foot of the drill.

Yet another object of the invention is to provide an entry and exit material that is inexpensive to manufacture and easy to use.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings that are for illustrative purposes only:

FIG. 1 is a schematic fragmentary cross-sectional view of one embodiment of an entry material according to the present invention.

FIG. 2 is a schematic fragmentary cross-sectional view of one embodiment of a laminated exit material according to the present invention.

FIG. 3 is an exploded cross-sectional view illustrating the elements of a method for drilling holes in a printed circuit board in accordance with the present invention.

DETAILED DESCRIPTION OF THE INVENTION

Referring more specifically to the drawings, for illustrative purposes the present invention is embodied in the apparatus generally shown in FIG. 1 through FIG. 3. It will be appreciated that the apparatus may vary as to configuration and as to details of the parts, and that the method may vary as to the specific steps and sequence, without departing from the basic concepts as disclosed herein.

Referring first to FIG. 1, the preferred embodiment of an entry material 10 according to the present invention comprises a laminate of a first metal layer 12 bonded to a preferably fibrous core 14 with a mixture of epoxy resin and a particulate lubricant. Entry material 10 is preferably formed using a roll press or the like, either with or without heat. The resultant entry material 10 preferably has an overall thickness of approximately 0.007 inches to approximately 0.016 inches after removal from the press. Additionally, entry material 10 is of sufficient rigidity to preclude the entry laminate from lifting off of the surface of the circuit board during drilling and withdrawal of the drill bit in the preferred embodiment.

Metal layer 12 is preferably made of a metal foil, such as aluminum or aluminum alloys such as 3003 or 3004 or the equivalents that are commercially available. The thickness of metal layer 12 is preferably in the range of approximately 0.001 inches to approximately 0.003 inches with approximately 0.002 inches being the preferred thickness.

Core 14 is preferably a cellulose paper but may be any type of fibrous material including fiberglass. Core 14 preferably has a thickness of between approximately 0.002 inches and approximately 0.010 inches with approximately 0.005 inches being the optimum thickness.

The adhesive to bond metal layer 12 to core 14 is preferably epoxy with a particulate lubricant additive. In one embodiment, the lubricant is preferably graphite with a particle size within the range of approximately 3 microns to approximately 50 microns in diameter. The graphite additive is preferably approximately 0.1 percent to approximately 10 percent by weight of the total mixture of epoxy and additive with approximately 2.0 percent being preferred. The graphite particles should be mixed thoroughly through the epoxy to assure an even distribution of the particles across the sheet.

In an alternative embodiment, granular polyethylene glycol is added as the lubricant to the epoxy. In this embodiment, the polyethylene glycol has a molecular weight within the range of approximately 600 to approximately 4000 depending on the length of the polymer chain. The 600 molecular weight polyethylene glycol (PEG-600) is preferred. The adhesive may have a mixture from approximately 0.1 percent to approximately 10 percent by weight of polyethylene glycol with approximately 1.0 percent being preferred.

In embodiment of entry material 10 shown in FIG. 1, a second metal layer 16 is bonded to core 14 with a mixture of epoxy and particulate lubricant. Metal layer 16 may be thicker than the first metal layer 12 to provide additional rigidity to the laminate as well as provide more efficient heat sink than is given by a thinner metal sheet. Metal layer 16 may also be the same or thinner than layer 12 to allow layer 16 of entry material 10 to conform to a rough or unequal surface of the printed circuit board and thereby maintain intimate contact with the board.

According to the present invention, the adhesive is typically applied to one side of the metal layer 12 or 16 to form a pre-laminate with the base or core 14. Adhesive may also be applied to the core 14 as an alternative. Thereafter, the pre-laminate is preferably placed in a press to produce a laminate entry material 10 that is of uniform thickness. The pre-laminate may be "cold pressed" or "hot pressed" depending on whether a cold curing type of adhesive is selected.

The preferred thickness of the entry sheet laminate 10 is within the range of approximately 0.007 inches to approximately 0.016 inches. During this process, the epoxy/lubricant mixture will normally impregnate the fibrous core 14 to produce a stiffened laminate sheet.

Referring now to FIG. 2, an embodiment of an exit material 18 according to the invention is shown. Exit material 18 comprises a metal layer 20 and a baseboard layer 22. Metal layer 20 is preferably a thin foil made of copper or aluminum that is bonded to base layer 22 with a mixture of epoxy and a particulate lubricant. Metal layer 20 preferably has a thickness within the range of approximately 0.001 inches to approximately 0.003 inches with approximately 0.002 inches being preferred.

Typically, the drill bit will not advance into exit material 18 beyond one third of the thickness of the exit material before being withdrawn. Therefore, the preferred exit material 18 has a second metal layer 24 that is laminated to the base layer 22 as seen in FIG. 2. This configuration allows the operator to turn the exit material over after the first drilling cycle in preparation for the next drilling cycle.

Base layer 22 preferably comprises a dense fiberboard such as Lebanite™ that, is approximately 0.040 inches to approximately 0.125 inches thick. Base layer 22 and metal layer 20 are compressed after the application of the lubricant-epoxy adhesive mixture to produce the desired product.

In an alternative embodiment of the exit material, base layer 22 is fabricated with particulate graphite or polyethylene glycol as a friction-reducing additive. For example, approximately 0.1 percent to approximately 10 percent of the total weight of the base layer 22 can be graphite, with approximately 2 percent graphite being preferred. Alternatively, the additive can be approximately 0.1 percent to approximately 10 percent by weight of polyethylene glycol, with approximately 1.0 percent by weight prior to pressing and heating being preferred. Additionally, since higher molecular weight polyethylene glycol molecules have higher melting points than lower molecular weight molecules, additive polyethylene glycol particles are preferably within the range of approximately 600 to approximately 4,000. Particles of higher molecular weight polyethylene glycol will resist melting during the fabrication and lamination procedures. Accordingly, it can be seen that the exit material of this embodiment is not only strong and rigid but includes drill lubricant within the adhesive and the base material 14.

Referring now to FIG. 3, a method for drilling printed circuit boards utilizing the entry and exit materials in accordance with the present invention is generally shown. Entry material 10 is placed on the planar surface of a printed circuit board 26. The printed circuit board 26 is positioned over the exit material 18. The high speed drill spindle and pressure foot 28 are lowered down until they engage the upper surface of the entry sheet 10 and the drill bit 30 proceeds through the entry material, the printed circuit board 26 and into the exit material 18 before being withdrawn. In the embodiment shown in FIG. 3, there are a total of three metal layers that act as heat sinks to draw heat from the drill bit 30 including layers 12 and 16 of the entry material and layer 20 of the exit material.

The temperature of the drill is also reduced by the release of lubricant when the drill bit 30 advances through the entry material 10 as well as the exit material 18. The lubricant reduces the frictional forces experienced by the drill bit 30 during the drilling cycle. Reduced friction and temperatures allow the drill bits to have longer useful life spans and thereby decrease the frequency of replacement of the bits and machinery down time.

Accordingly, it will be seen that this invention provides an entry and exit laminate material that includes at least one metal layer bonded to a fibrous base layer by a mixture of epoxy adhesive and a particulate lubricant. Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the, phrase "means for."

What is claimed is:

1. A sheet laminate material for drilling a printed circuit board, comprising:
   a first metal sheet;
   a second metal sheet; and
   a fibrous core;
   said fibrous core coupled to said first metal sheet with a first adhesive layer;
   said fibrous core coupled to said second metal sheet with a second adhesive layer;
   wherein said adhesive layers contain a particulate lubricant, said lubricant comprising polyethylene glycol having a molecular weight ranging from approximately 600 to approximately 4,000.

2. A sheet laminate material as recited in claim 1, wherein said adhesive layers comprise epoxy resin.

3. A sheet laminate material as recited in claim 1, wherein said adhesive layers contain approximately 0.1 percent to approximately 10 percent by weight of polyethylene glycol particulates.

4. A sheet laminate material as recited in claim 1, wherein said metal sheets have a thickness of between approximately 0.001 inches and approximately 0.003 inches.

5. A sheet laminate material as recited in claim 1, wherein said fibrous core has a thickness of between approximately 0.002 inches to approximately 0.01 inches; wherein said adhesive layers are permeated through said fibrous core.

6. A sheet laminate as recited in claim 1, wherein said sheet laminate material is compressed to a thickness of between approximately 0.007 to approximately 0.016 inches.

7. A sheet laminate material for drilling a printed circuit board, comprising:
   a first substrate layer;
   a second substrate layer; and
   a fibrous core;
   said fibrous core coupled to said first substrate with a first adhesive layer;
   said fibrous core coupled to said second substrate with a second adhesive layer;
   wherein said adhesive layers contain a particulate lubricant, said lubricant comprising polyethylene glycol having a molecular weight ranging from approximately 600 to approximately 4,000.

8. A sheet laminate material as recited in claim 7, wherein said adhesive layers contain approximately 0.1 percent to approximately 10 percent by weight of polyethylene glycol particulates.

9. A sheet laminate material as recited in claim 8, wherein said adhesive layers contain approximately 1 percent by weight of polyethylene glycol particulates.

10. A sheet laminate material as recited in claim 7, wherein said first substrate layer and said second substrate layer comprises metal foil.

11. A sheet laminate material as recited in claim 10, wherein said metal foil layers have a thickness of between approximately 0.001 inches and approximately 0.003 inches.

12. A sheet laminate material as recited in claim 7, wherein said fibrous core has a thickness of between approximately 0.002 inches to approximately 0.01 inches; wherein said adhesive layers permeate through said fibrous core.

13. A sheet laminate material as recited in claim 7, wherein said adhesive layers comprises epoxy resin.

* * * * *